United States Patent
Siddiqui et al.

(10) Patent No.: US 10,551,423 B1
(45) Date of Patent: Feb. 4, 2020

(54) SYSTEM AND METHOD FOR SIMULTANEOUS TESTING OF RADIATION, ENVIRONMENTAL AND ELECTRICAL RELIABILITY OF MULTIPLE SEMICONDUCTOR ELECTRICAL DEVICES

(71) Applicant: U.S. Government as Represented by the Secretary of the Army, Picatinny Arsenal, Dover, NJ (US)

(72) Inventors: Jeffrey Siddiqui, Sacramento, CA (US); Kevin Geoghegan, Roseville, CA (US); Tom Shepherd, Roseville, CA (US)

(73) Assignee: The United States of America as Represented by the Secretary of the Army, Washington, DC (US)

( * ) Notice: Subject to any disclaimer, the term of this patent is extended or adjusted under 35 U.S.C. 154(b) by 743 days.

(21) Appl. No.: 14/994,700

(22) Filed: Jan. 13, 2016

Related U.S. Application Data

(60) Provisional application No. 62/102,699, filed on Jan. 13, 2015.

(51) Int. Cl.
*G01R 31/00* (2006.01)
*G01R 31/265* (2006.01)

(52) U.S. Cl.
CPC ......... *G01R 31/003* (2013.01); *G01R 31/265* (2013.01)

(58) Field of Classification Search
CPC ............................ G01R 31/003; G01R 31/265
See application file for complete search history.

(56) References Cited

U.S. PATENT DOCUMENTS

| | | | |
|---|---|---|---|
| 4,172,228 A | 10/1979 | Gauthier |
| 4,288,911 A | 9/1981 | Ports |
| 4,575,676 A | 3/1986 | Palkuti |
| 4,839,586 A | 6/1989 | Musseau |

(Continued)

OTHER PUBLICATIONS

Geoghegan, PMOS negative bias temperature instability in an ionizing radiation environment, Dissertation, Naval Postgraduate School, Monterey, CA, 2013.*

(Continued)

*Primary Examiner* — Daniel R Miller
(74) *Attorney, Agent, or Firm* — John P. DiScala

(57) ABSTRACT

The present invention relates to a system and method for the simultaneous testing of radiation, environmental and electrical reliability of multiple semiconductor devices. The system provides a simultaneous simulation of the space environment in which a device under test (DUT) is expected to operate under thereby providing an accurate test environment. One or more DUTs are simultaneously subject to each of a radiating dose, electrical bias and varying temperature. Additionally, each of the above may be varied over a range of values to provide test data under multiple testing conditions. Finally, a method for operating the system is provided which ensures reliable and high fidelity data from the system. The system comprises seven (7) interconnected subsystems, an electrical environmental subsystem, a radiation subsystem, an environmental control system, a radiation source control system, a temperature monitoring subsystem, an electrical stimulation and data acquisition subsystem and a data processing and analysis subsystem.

15 Claims, 12 Drawing Sheets

(56) References Cited

U.S. PATENT DOCUMENTS

| | | | |
|---|---|---|---|
| 5,111,137 A | | 5/1992 | Heurmann |
| 5,516,731 A | | 5/1996 | Toutounchi |
| 5,833,365 A | * | 11/1998 | Stals ................... G01R 19/32 |
| | | | 374/5 |
| 6,169,409 B1 | | 1/2001 | Amemiya |
| 6,870,378 B1 | | 3/2005 | Cole |
| 7,224,173 B2 | | 5/2007 | Hung |
| 2005/0017741 A1 | | 1/2005 | Harwood |
| 2013/0125676 A1 | | 5/2013 | Tockstein |

OTHER PUBLICATIONS

Pentrack et al., Combined effects of gamma radiation and temperature on fiber optic systems, Proc. SPIE 3714, Enabling Photonic Technologies for Aerospace Applications, 1999.*

DMEA—Gamma Irradiation Testing Facility (DMEA), available at https://www.dmea.osd.mil/gammatest.html on Mar. 6, 2010 (Year: 2010).*

Greenwell et al., Radiation testing of electro-optic devices in compliance with IEEE 1156.4, Proc. SPIE 3872, Photonics for Space and Radiation Environments, 1999 (Year: 1999).*

Microelectronics, available at https://www.dictionary.com/browse/microelectronics on Mar. 14, 2019 (Year: 2019).*

Geoghegan et al., PMOS NBTI analysis of a 45nm CMOS-SOI Process with Nitrided Gate Dielectric, 2012 IEEE International Integrated Reliability Workshop Final Report, pp. 199-202, 2012 (Year: 2012).*

Geoghegan, Kevin B. et al., "Observed Effects of Ionizing Radiation on PMOS Negative Bias Temperature Instability", 2014 Nuclear and Space Radiation Effects Conference, IEEE, Paris, France, Jul. 2014.

* cited by examiner

SYSTEM AND METHOD FOR SIMULTANEOUS TESTING OF RADIATION, ENVIRONMENTAL AND ELECTRICAL RELIABILITY OF MULTIPLE SEMICONDUCTOR ELECTRICAL DEVICES

CROSS REFERENCE TO RELATED APPLICATION

The present application is a non-provisional application of U.S. provisional application Ser. 62/102,699, filed Jan. 13, 2015, the contents of which are incorporated herein by reference.

FEDERAL RESEARCH STATEMENT

The invention described herein may be manufactured, used, and licensed by or for the U.S. Government for U.S. Government purposes.

BACKGROUND OF INVENTION

Field of the Invention

The present invention relates to reliability testing of semiconductor devices, and more particularly to radiation, environmental and electrical reliability testing of semiconductor devices.

Related Art

Spacecraft play an increasingly vital role in modern society. Satellites, probes and shuttles are employed in wide ranging, and often critical, applications for civilian, academic and military organizations. Satellites, for example, form an integral piece of our communication networks, navigational capabilities and weather and climate monitoring. To successfully perform these functions, spacecraft depend on their various electronic equipment functioning in the harsh environment of space.

Accordingly, semiconductor devices intended for use in space environments are subject to various reliability tests to determine the effects of the space environment on their operation. During these tests, attempts are made to replicate the conditions these devices will be exposed to in space while a variety of operational parameters are observed. However, current methods do not provide the most accurate reproduction of this space environment. Particularly in regard to radiation, environmental and electrical environment, current testing methods require improvement.

In the space environment, electronics are subjected to electronic conditions that bring about various reliability degradation mechanisms including negative bias temperature instability (NBTI) and environmental conditions such as ionizing radiation. The effects of both of these conditions are important in understanding the operation of electronics in space. However, current practice is to conduct testing for each condition separately under the assumption that the effects of each may be combined serially to determine their overall effect. Simultaneous testing could provide a more accurate result.

Accordingly, there is a need for a system and method for simultaneously testing of radiation, environmental and electrical reliability of multiple semiconductor electrical devices.

SUMMARY OF INVENTION

The present invention relates to a system and method for simultaneously testing of radiation, environmental and electrical reliability of multiple semiconductor electrical devices.

According to a first aspect of the invention, a system for simultaneously testing the radiation, environmental and electrical reliability of a semiconductor device under test, the system includes an electrical environmental subsystem, an environmental control subsystem, a radiation subsystem, a radiation source control subsystem, a temperature monitoring subsystem and an electrical stimulation and data acquisition subsystem. The electrical environmental subsystem simultaneously provides electrical stimulus to the semiconductor device under test and an isolated thermal testing environment for the semiconductor device under test. The environmental control subsystem controls the thermal environment of the electrical environmental subsystem. The radiation subsystem simultaneously irradiates the semiconductor device under test with a radiation source. The radiation source control subsystem controls the radiation dose of the semiconductor device under test. The temperature monitoring subsystem records the temperature of the semiconductor device under test. The electrical stimulation and data acquisition subsystem provides electrical stimulation to the semiconductor device under test and acquires one or more performance parameters of the semiconductor device under test.

In a second aspect, a method of simultaneously testing the radiation, environmental and electrical reliability of a semiconductor device under test includes the steps of: setting the temperature of an electrical environmental test platform test chamber to a test temperature; thermally isolating the electrical environmental test platform test chamber; irradiating the device under test; applying an electrical bias to the semiconductor device under test while the semiconductor device under test is being irradiated; and capturing one or more performance parameters of the semiconductor device under test while the semiconductor device under test is simultaneously exposed to a controlled thermal environment, radiation and electric stimulation.

In a third aspect, a method of simultaneously testing the radiation, environmental and electrical reliability of a semiconductor device under test comprising the steps of: staging components of a system for simultaneously testing the radiation, environmental and electrical reliability of a semiconductor device under test; loading the semiconductor device under test onto an electrical environmental test platform; preparing the electrical environmental test platform for environmental control; inserting the electrical environmental test platform into a radiation subsystem; setting the temperature of an electrical environmental test platform test chamber to a test temperature; thermally isolating the electrical environmental test platform test chamber; irradiating the device under test; applying an electrical bias to the semiconductor device under test while the semiconductor device under test is being irradiated; and capturing one or more performance parameters of the semiconductor device under test while the semiconductor device under test is simultaneously exposed to a controlled thermal environment, radiation and electric stimulation.

In a fourth aspect, a method for temperature correcting data from a simultaneous test of radiation, environmental and electrical reliability of a semiconductor device under test, the method comprising the steps of: capturing a raw performance parameter value of the semiconductor device under test while the semiconductor device under test is simultaneously exposed to a controlled thermal environment, radiation and electric stimulation; associating the raw performance parameter value with an associated time and temperature; determining a performance parameter offset value of the raw performance parameter value according to the temperature associated with the raw performance parameter value; and adding the performance parameter offset value to the raw performance parameter value to determine a corrected performance parameter value.

BRIEF DESCRIPTION OF THE DRAWINGS

The accompanying figures further illustrate the present invention.

The components in the drawings are not necessarily drawn to scale, emphasis instead being placed upon clearly illustrating the principles of the present invention. In the drawings, like reference numerals designate corresponding parts throughout the several views.

DETAILED DESCRIPTION

The present invention relates to a system and method for the simultaneous testing of radiation, environmental and electrical reliability of multiple semiconductor devices. The system provides an accurate test environment by simulating the three key elements of an electronic space environment in which a device under test (DUT) is expected to operate. One or more DUTs are simultaneously subject to each of a radiating dose, electrical bias and varying temperature. Additionally, each of the above elements may be controlled over a range of values to provide test data under multiple testing conditions. Finally, a method for staging, setting up and operating the system is provided which ensures a suitable operating environment for the test equipment as well as reliable and high fidelity data from the system.

Figure 1:
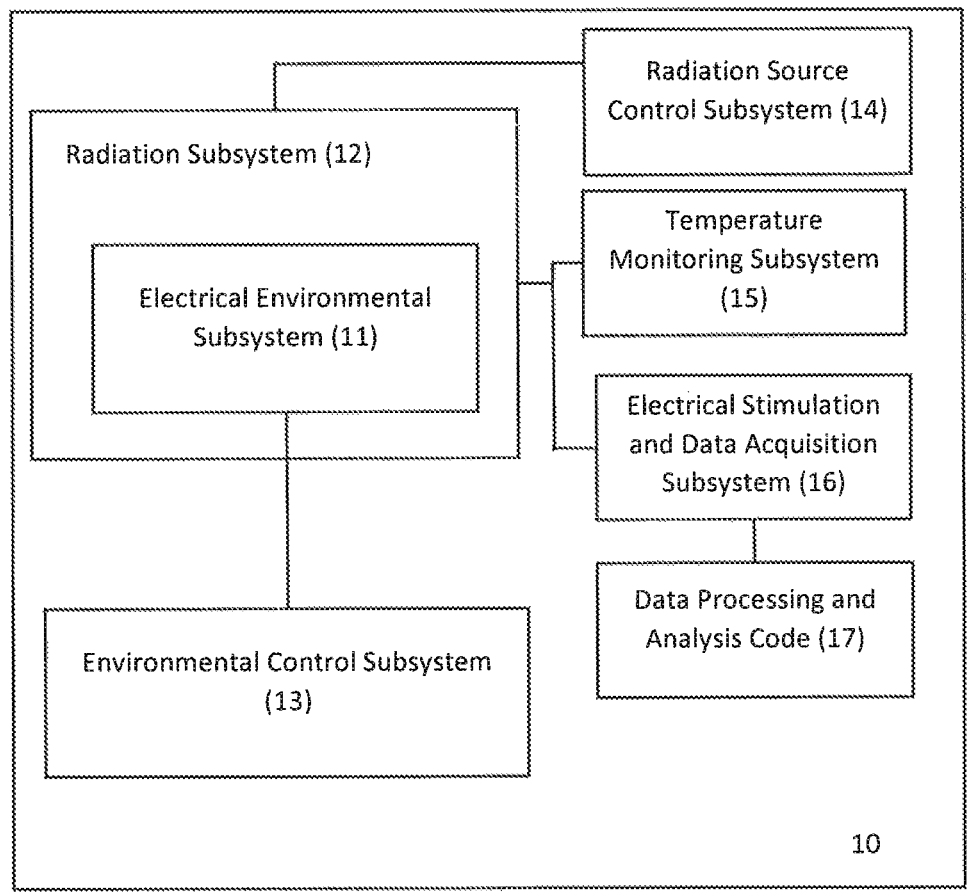
FIG. 1 is a functional block diagram of the system for simultaneously testing of radiation, environmental and electrical reliability, in accordance with one illustrative embodiment of the invention.

FIG. 1 is a functional block diagram of the system for simultaneous testing of radiation, environmental and electrical reliability, in accordance with one illustrative embodiment of the invention. The system 10 comprises seven (7) interconnected subsystems, an electrical environmental subsystem 11, a radiation subsystem 12, an environmental control system 13, a radiation source control subsystem 14, a temperature monitoring subsystem 15, an electrical stimulation and data acquisition subsystem 16 and a data processing and analysis subsystem 17.

Figure 2:
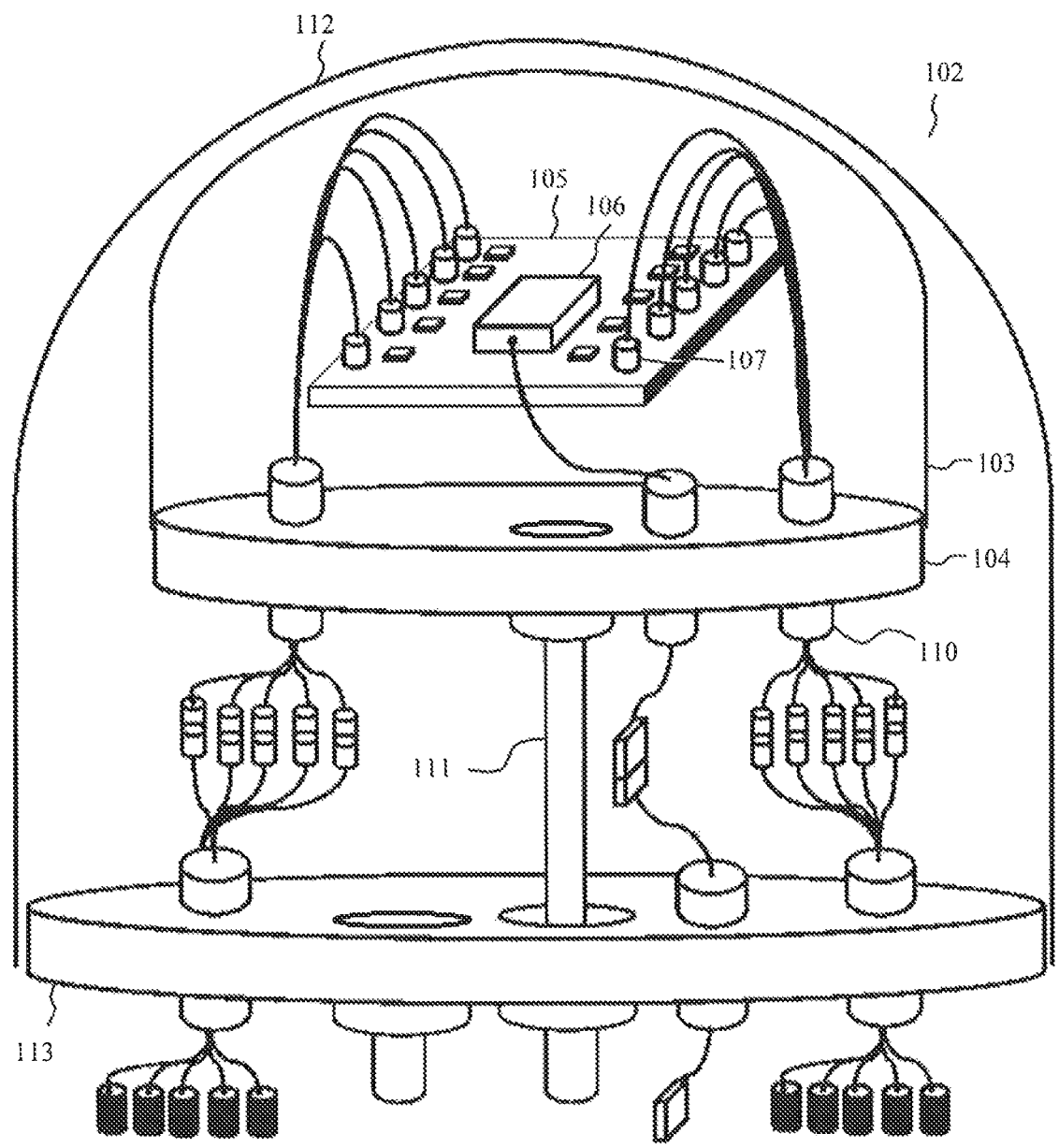
FIG. 2 depicts an electrical environmental test platform of the system for simultaneously testing of radiation, environmental and electrical reliability, in accordance with one illustrative embodiment of the invention.

FIG. 2 depicts an electrical environmental test platform of the system for reliability testing, in accordance with one illustrative embodiment of the invention. The electrical environmental subsystem 11 is an electrical environmental test platform (EETP) 102 comprised of two chambers. The EETP 102 employs a two vacuum-chamber design as well as gas or liquid flow to control the temperature of the DUT which allows for a range of −150 degrees Celsius (C) to 150 degrees C. without placing the radiation subsystem 12 at risk of overheating.

An inner chamber of the EETP 102 comprises an inner chamber cover 103 and a first base plate 104. The inner chamber of the EETP 102 is configured for providing a vacuum sealed enclosure simulating the thermal environment of space and further comprises a vacuum line 111 for purging the inner chamber with Nitrogen (N2) and evacuating to create a vacuum.

The inner chamber houses a customized printed circuit board 105 (PCB) which further comprises a DUT socket which has eighteen (18) pin zero-insertion positions for receiving one or more DUTs. The PCB 105 is configured for providing electrical stimulation to the DUT, sensing and transmitting electrical characteristics of the DUT, and allowing troubleshooting of any step in the test process. This configuration, along with the electrical stimulation and data acquisition subsystem 16 can accommodate eighteen electrical ports thereby providing flexibility in the number of the devices that can be measured at once. For example, the system may be used to measure six devices with three ports each, four devices with four ports each, three devices with five ports each or any other combination of devices so long as the ports do not exceed the number of pins. While the semiconductor described herein comprises eighteen pins (not shown), the PCB 105 is not limited to eighteen pins.

PCB's with more than eighteen and less than eighteen pins are contemplated by this invention.

The PCB 105 further comprises eighteen micro-coaxial (MCX) connections 107 and eighteen vertical shielded test jack (VSTJ) connections for probing each electrical signal directly at the board level. The MCX connections 107 are configured for sourcing and measuring the electrical signals to and from the DUT. They allow electrical connection between the PCB 105 (and thus the DUT) and the electrical stimulation subsystem (via several cable assemblies). Depending on the desired test, the electric stimulation and data analysis subsystem may apply a controlled voltage or current to the DUTs. For example, the electric stimulation and data analysis subsystem may apply a negative gate terminal bias to a transistor DUT in order to perform a negative bias temperature instability (NBTI) test.

The VSTJ connections allow probing any signal line as close to the DUT as possible with an external sense such as an oscilloscope. This probing was necessary to troubleshoot the exact order of operations required for proper electrostatic discharge safety. These test points are also useful to monitor the isolation of a DUT during loading and unloading procedures.

Each of the MCX connections 107 connect data interconnects 108 from the PCB 105 (and thus the DUT) to the electrical stimulation and data acquisition system. The data cables 108 are Kapton vacuum and radiation tolerant coaxial cables.

The EETP 102 further comprises a thermocouple 109 configured for sensing the temperature of the DUT. Advantageously, the thermocouple 109 is located on the DUT socket of the PCB 105 thereby providing accurate temperature data. The thermocouple 109 has an integrated cable that is extended with thermocouple 109 cable all the way to the thermocouple 109 data capture hardware and software. Alternate thermocouple configurations allowing for temperature sensing closer to the DUT, such as the thermocouple at (or inserted in) the DUT package itself, are contemplated by this invention.

The data cables transmitting data from the PCB 105 are divided into two assemblies. Each of the cable assemblies exits the inner chamber via a vacuum sealed feed through 110 in the first baseplate. Each assembly is a number of Kapton coaxial cables potted together with vacuum tight sealant in a fixture that is screwed into a hole in the first baseplate. This allows electrical signals to pass into the inner chamber while keeping the temperature of the inner chamber isolated from the radiation subsystem 12 by the vacuum of the outer chamber.

An outer chamber of the EETP 102 is configured for isolating the first chamber environment from the environment within the radiation chamber via a vacuum sealed enclosure. The outer chamber comprises an outer chamber cover 112 and a second base plate 113 and a vacuum line 111.

The cable assemblies enter the outer chamber from the inner chamber via the vacuum sealed feed through 110 in the first base plate 104. Another set of identical cable assemblies with vacuum sealed feed-through 110 fixtures carry the electrical signal out of the outer chamber.

The radiation subsystem 12 is configured for providing a controlled dose of radiation to the DUT. In an embodiment of the invention, the radiation subsystem 12 may be a High Dose Gamma Ray Irradiator manufactured by J.L Shepherd & Associates of San Fernando, Calif. The radiation subsystem 12 is configured for receiving a radiation level input from a user and delivering that radiation level to the DUT at a desired time and for a desired amount of time.

The radiation subsystem 12 comprises a high dose chamber for receiving the EETP 102. As described above, the high dose chamber is isolated from the desired test temperature of the DUT by the vacuum created by the outer chamber of the EETP 102. Accordingly, the radiation subsystem 12 may function without danger of being exposed to potentially harmful temperatures.

A radiation source control subsystem 14 is in communication with radiation subsystem 12. The radiation source control subsystem 14 is configured for receiving an input specifying control parameters for the radiation subsystem 12 and transmitting one or more control signals in accordance with those control parameters. Control parameters comprise radiation level, radiation initiation time and radiation duration. The radiation source control subsystem 14 further receives status information from the radiation subsystem 12.

As will be described in further detail below, the radiation subsystem 12 is configured in a specific manner prior to and during testing so that inherent electrostatic discharge from the irradiator and other subsystems does not propagate to the sensitive DUT.

While the radiation subsystem 12 is described throughout this specification as providing a controlled dose of gamma ray radiation, such as from Cobalt-60 or Cesium-137, the radiation subsystem 12 is not limited to providing gamma ray radiation. It is contemplated that in other embodiments with modifications to the EETP 102 and associated control system, the radiation subsystem 12 may provide one or more of the following types of radiation to the DUT: X-rays; neutrons; protons; heavy ions; alpha radiation; and beta radiation.

The electrical stimulation and data acquisition subsystem 16 is configured for stimulating and acquiring data from the DUT via the EETP 102 and various data cable assemblies as described in this patent. The electrical stimulation and data acquisition subsystem 16 is in communication with the EETP 102 and is configured for electrically biasing the DUT. The electrical stimulation and data acquisition subsystem 16 is further configured for acquiring data from the DUT by way of typical DUT test techniques, such as transistor I-V curves in order to establish degradation of various transistor parameters.

The electrical stimulation and data acquisition subsystem 16 comprises a semiconductor parameter analyzer for conducting electrical stimulation and/or characterization of the DUT. For example, the semiconductor parameter analyzer may perform I-V and C-V measurements, ultra-fast pulsed I-V, waveform capture and transient I-V measurements. The semiconductor parameter analyzer may be a Keithley 4200-SCS Parameter Analyzer available from Tektronix, Inc. of Beaverton, Oreg.

For transmitting and receiving electrical signals, the electrical stimulation and data acquisition subsystem 16 further comprises a switch matrix such as a Keithley 707A switch matrix available from Tektronix, Inc., one or more switch cards such as Keithley 7174 switch cards available from Tektronix, Inc., a power supply such as a Hewlett Packard 6626A power supply available from HP, Inc. of Palo Alto, Calif. and one or more triaxial electrical signal cables.

The temperature monitoring subsystem 15 monitors the environmental temperature of the DUT, as recorded by a thermocouple 109 in contact with the DUT socket. Another contemplation of this embodiment is a thermocouple 109 attached to, or inserted directly in, a DUT. The temperature monitoring subsystem 15 comprises a computer device configured for receiving temperature data from a thermocouple 109. The computer device receives the temperature data via one or more communication cables. The computer device is further configured for executing software for recording the temperature read at the DUT and executing software that allows the MatLAB code to link temperature data to the electrical, radiation, and time data also collected by the system.

The data processing and analysis subsystem 17 further comprises a computer device for processing and analyzing data received from the EETP 102, such as a personal computer executing MatLAB software available from Mathworks, Inc. of Natick, Mass. The computer executes custom data analysis code written to extract transistor DUT parameters of interest to the space reliability community such as threshold voltage, field effect mobility, on-current, and other similar parameters. The code also provides time, total radiation dose, and temperature information to each parameter so trends can be established in multiple dimensions. As can be understood to one skilled in the art, this is very important to establishing root cause physical mechanisms for space-based electronic performance degradation.

Temperature correction of the DUT electrical data greatly increases the fidelity of the measured data and allows for a more clear analysis of electrical trends with time and temperature. In addition, the code corrects for hardware temperature variation when tests are conducted in constant temperature mode. Radiation and temperature control hardware typical of the type used in this invention has a fidelity of +/−4 degrees Celsius (C). Typical transistor DUTs used in space systems can have performance parameters, such as threshold voltage, that change significantly over this small temperature range. Subtle trends leading to scientific discovery can be missed without correcting for this variation. As will be described below in further detail, in post processing of data, the electrical stimulation and data acquisition subsystem 16 executes a method that calibrates any DUT performance parameters across the +/−4 degree C. range due to only temperature changes. Accordingly, the system provides data with +/−0.1 degree C. variation. With this calibration data, actual test data can be corrected to a single temperature, between the +/−4 degree C. range of the hardware. The result is actual test data can be analyzed across temperature, radiation dose, and electrical stress levels without temperature distortion hiding, possibly important, subtle data trends.

FIGS. 3-9 are flowcharts illustrating methods of configuring, staging and simultaneously testing of radiation, environmental and electrical reliability of multiple semiconductor electrical devices, in accordance with one illustrative embodiment of the invention. The methods shown allow for performing electrical reliability testing while simultaneously providing a variable level of radiation exposure and variable temperature setting. The methods shown are directed toward a method for determining the negative bias temperature instability (NBTI) in response to an electric bias stress and gamma radiation exposure at a set temperature. While the methods shown are directed toward an NBTI test with gamma radiation, the method is not limited to NBTI testing and gamma radiation. The system and method are capable of performing a variety of electric reliability tests including any test that can be performed by sourcing voltage or current and measuring voltage, current, or capacitance of an electronic device. For example, the system and method may be implemented to perform hot carrier injection test, stress induced leakage current test, electromigration test, charge breakdown test, time dependent dielectric breakdown test, threshold voltage stability and many other similar tests.

Figure 3:
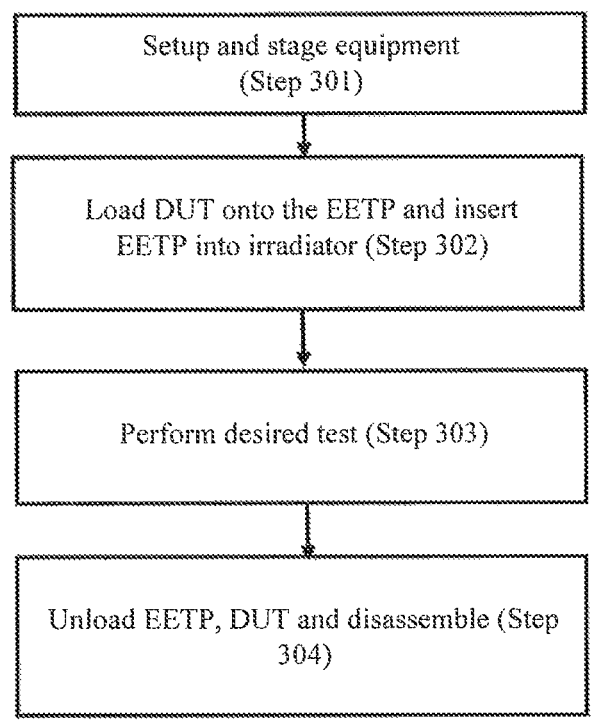
FIG. 3 is a flowchart illustrating steps for a method of configuring a system for simultaneously testing the radiation, environmental and electrical reliability of multiple semiconductor electrical devices, in accordance with one illustrative embodiment of the invention.

FIG. 3 is a flowchart illustrating steps for a method of configuring a system for simultaneously testing the radiation, environmental and electrical reliability of multiple semiconductor electrical devices, in accordance with one illustrative embodiment of the invention. As electronics shrink in size and voltage tolerance, individual parts are more and more susceptible to electrostatic discharge (ESD). As the space community continues to use more and more advanced commercial technologies in space-borne applications, the ability to test practical (i.e. small) devices for radiation, environmental and electrical reliability with tight ESD tolerances becomes key. The method described in FIG. 5, successfully minimizes the risk of ESD when using equipment for simultaneously testing for radiation, environmental and electrical reliability.

At step 301, the equipment is setup and staged. Due to ESD sensitivity, the equipment comprising the system must be set up and staged in a precise manner. A missed step or a tool touching the equipment in a non-controlled manner could cause catastrophic damage to the DUT. The step of setting up and staging the equipment comprises sub-steps further detailing the equipment setup and staging as described below in reference to FIG. 4.

At step 302, the DUT is loaded on the EETP 102 and inserted into the irradiator. The step of loading the DUT onto the EETP 102 further comprises sub-steps as described below in reference to FIG. 5. The EETP 102 is prepared for environmental control and inserted into the irradiator. The step of preparing the EETP 102 for environmental control further comprises the sub-steps of sealing the EETP 102 inner and outer chambers, placing the EETP 102 on the irradiator insertion cart, inserting the EETP 102 into the irradiator, connecting the environmental control pipes, tubes and cables, and routing the electrical signal cables from the EETP 102 out of the irradiator. These sub-steps are described in more detail in reference to FIG. 6.

At step 303, the desired test is performed by the system 10. The step of performing the desired test comprises sub-steps described further in FIGS. 7-9.

At step 304, the EETP is unloaded from the irradiator and the DUT is removed. The equipment of the various subsystems is disassembled.

Figure 4:
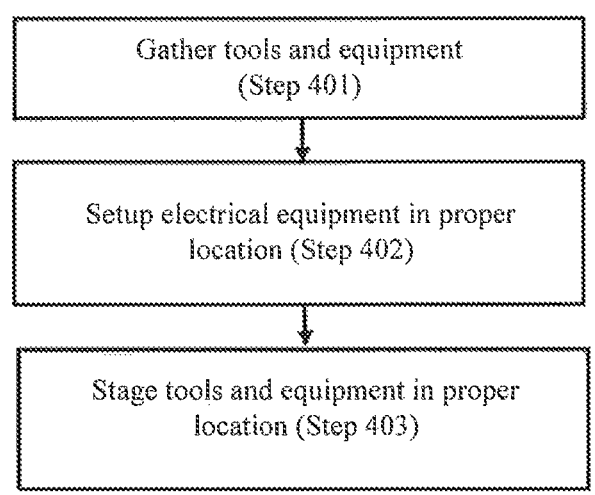
FIG. 4 is a flowchart illustrating steps for a method of setting up and staging a system for simultaneously testing the radiation, environmental and electrical reliability of multiple semiconductor electrical devices, in accordance with one illustrative embodiment of the invention.

FIG. 4 is a flowchart illustrating steps for a method of setting up and staging a system for simultaneously testing the radiation, environmental and electrical reliability of multiple semiconductor electrical devices, in accordance with one illustrative embodiment of the invention. At step 401, the equipment and tools are gathered. The equipment includes all of the devices comprising the subsystems as described above.

At step 402, the electrical equipment is setup in the proper locations. Proper setup of the equipment is critical to mitigating the risk of ESD issues. This includes both the position of the equipment in relation to other equipment as well as the order of certain steps of the setup. First, room temperature and humidity of the testing location are tested to ensure safe working conditions for the devices. Forty percent to sixty percent relative humidity is generally considered a safe range but can be DUT dependent. The semiconductor parameter analyzer is positioned next to the high dose chamber. The semiconductor parameter analyzer is then setup and plugged in to a power source. Parameter analyzer earth ground and common must be disconnected. The semiconductor parameter analyzer should be warmed up for thirty minutes. Next, the semiconductor parameter analyzer connections are verified.

The power source is then setup by being plugged in and powered on. The output is connected to the switch matrix so it can be applied to the DUT, when needed. Next, the desired stress voltage is entered. The output is then disabled.

The DUT board 105 is then attached to the EETP 102 mount physically and electrically by connecting Kapton signal cables to the DUT PCB board 105. The EETP 102 thermocouple 109 is attached next to the DUT socket. Finally, Kapton signal cables are connected to the switch matrix triax cables.

At step 403, staging all tools and equipment in the proper and safe locations. Much like the setup of the equipment, proper staging of the equipment is critical to mitigating the risk of ESD issues. This includes both the position of the equipment in relation to other equipment as well as the order of certain steps of the setup.

ESD mats are arranged around the equipment and the setup cart is configured. The setup cart is used to hold tools and materials during setup. The top and bottom working surfaces of the setup cart are covered with ESD mat material. All tools are then placed on the top working surface on ESD material. An ESD box containing the DUT and ESD tweezers are also placed on the top working surface.

Next, copper gaskets are installed on all necessary vacuum lines and tubes 111. Any handling or metal-to-metal connecting that could result in an ESD pulse and can be performed before the DUT is loaded, must be performed at this time.

Grounding is then performed. All metal elements that will be later assembled to create the system are attached to grounded wires, in the home run configuration in order to reduce dangerous, ESD causing, ground loops. Elements include, but are not limited to the radiation subsystem 12, exhaust pipes, the EETP 102 setup cart, the individual EETP 102 chamber covers and inner structure, vacuum pipes.

Any non-metal ESD sensitive items, such as insulating shrouds, screwdrivers, other tools etc. are placed on grounded ESD mats.

ESD wrist straps are plugged into the semiconductor parameter analyzer earth ground. ESD jackets are then put on.

Next, an air ionizer is positioned and turned to "on" in order to keep ionized air flowing across the DUT socket at all times during setup.

Next, the environmental control subsystem is prepared. The vacuum pump oil level is checked. The N2 reservoir tanks are then filled to 30 pounds per square inch (psi).

All thermocouple 109 cables are checked to ensure that they are attached in their final configuration. The DUT thermocouple 109 is attached to the DUT socket to ensure proper connection. The EETP 102 outer chamber cover 112 is attached to the thumb port screw on the outer chamber cover 112.

The environmental control subsystem is then turned on.

Finally, it has been discovered that due to the electronics and grounding of the radiation subsystem 12 and electrical stimulation and data acquisition subsystem 16 the grounds must be kept as far apart as possible. Separate breakers are suggested and used in this embodiment.

Figure 5:
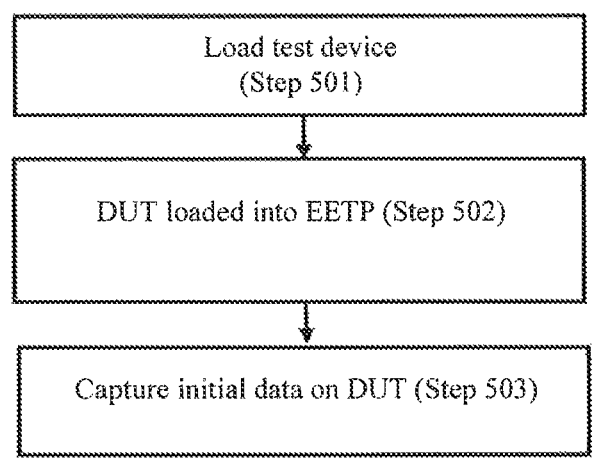
FIG. 5 is a flowchart illustrating steps for a method of loading a device under test, in accordance with one illustrative embodiment of the invention.

FIG. 5 is a flowchart illustrating steps for a method of loading a device under test, in accordance with one illustrative embodiment of the invention.

At step 501, if desired, a test device may be loaded into the DUT socket of the EETP 102. The test device may be used to determine that the system is operating correctly prior to inserting sensitive or costly DUTs.

At step 502, the DUT is loaded into the EETP 102. ESD protection should be worn by all technicians handling the DUT. Electrical connections of the DUT are connected to one or more of the 18 electrical ports of the EETP 102 via the DUT socket. More than one DUT may be loaded into the EETP 102 at this step as long as the electrical connections of the DUTs do not exceed the electrical ports of the EETP 102. For example, a single test may involve four 4-port devices. While, the EETP 102 described throughout this specification comprises a printed circuit board 105 comprising 18 electrical ports, the EETP 102 is not limited to a semiconductor with 18 electrical ports. The EETP 102 may comprise more or less than 18 ports. Once the device is loaded into the socket, it is locked in place.

At step 503, initial data on the packaged part is captured. The initial data comprises results for whichever individual tests are required by the experiment. In this embodiment, data required to characterize negative bias temperature instability such as, but not limited to, current-voltage (IV) curves is captured. From this initial data, it can be determined whether the DUT is a candidate for experimentation (typical/representative device).

Figure 6:
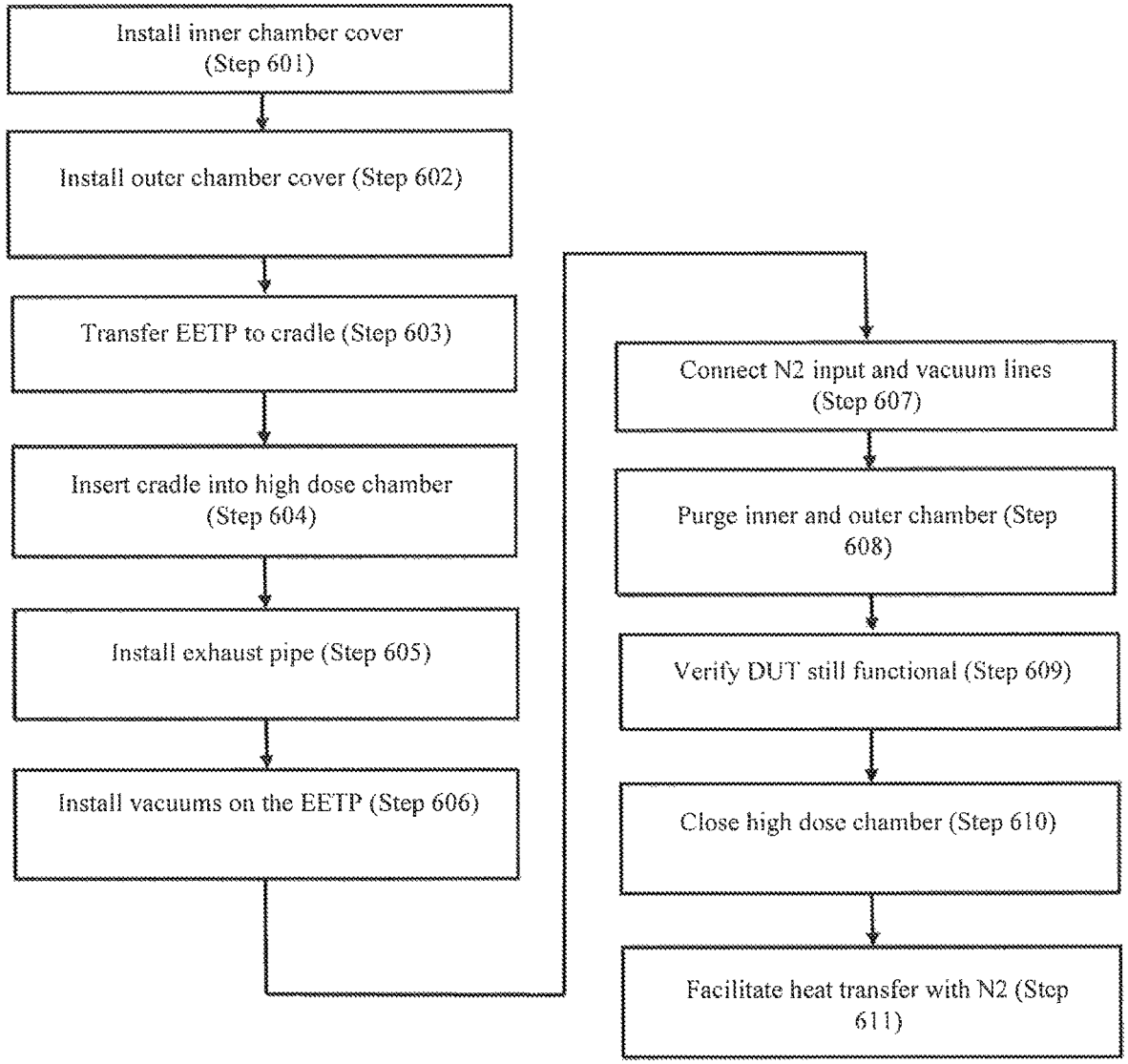
FIG. 6 is a flowchart illustrating steps for a method of preparing an electrical environment test platform for environmental control, in accordance with one illustrative embodiment of the invention.

FIG. 6 is a flowchart illustrating steps for a method of preparing an electrical environment test platform for environmental control, in accordance with one illustrative embodiment of the invention.

At step 601, the inner chamber cover 103 of the EETP 102 is installed. The inner chamber cover 103 is placed on the EETP 102 inner chamber baseplate. Screws located on the inner chamber cover 103 are tightened to an initial tightness. The grounding wire is then removed from the inner chamber cover 103. To ensure ESD protection, the wire should not contact the ground plane during and after removal. The grounding wire should be stored away from the system. The screws of the inner chamber cover 103 are then tightened further to a final tightness.

At step 602, the outer chamber cover 112 of the EETP 102 is installed. The outer chamber cover 112 is placed on the EETP 102. The clamps of the outer chamber cover 112 are then installed. The grounding wire is then removed from the outer chamber cover 112. To ensure ESD protection, the wire should not contact the ground plane during and after removal. The grounding wire should be stored away from the system.

At step 603, the EETP 102 is transferred to the cradle. To transfer the EETP 102 to the cradle, a setup stand restraining bar is removed and signal cables are unclamped. Once the EETP 102 is physically on the cradle, a first cradle clamp and then a second cable clamp located closer to the high dose irradiator are attached.

At step 604, the cradle is inserted into the high dose chamber. The ground is removed from the cradle. The insertion rod is slid so that the cradle enters the chamber. Once inside the chamber, the cradle cart is lowered and the cradle rests on the experimental cart. The experimental cart is then moved into the test position.

At step 605, a small exhaust pipe is installed by manually moving the external exhaust pipe into position and installing into the EETP 102. The grounding wire is removed from the small gooseneck pipe and placed on the ESD mat to the left of the high dose chamber. The other side of the pipe is then attached to the exhaust.

At step 606, vacuum lines are installed on the EETP 102. First, an inner chamber vacuum hose is installed. Next, an outer chamber vacuum hose is installed.

At step 607, the EETP 102 nitrogen input and vacuum lines 111 are connected to the EETP 102 and the environmental control subsystem and insulation is wrapped around the small exhaust pipe and the EETP 102 in the high dose chamber.

At step 608, the EETP 102 inner and outer chamber are purged with nitrogen and evacuated. The vacuum pump provides a vacuum environment within both chambers creating the necessary temperature insulation that allows the EETP 102 to reach full temperature range while not overheating or over-cooling the radiation subsystem. In one embodiment, the vacuum level setpoint range is $6.5$-$7\times10^{-2}$ torr.

At step 609, experimental data may optionally be run to verify that the test setup and DUT are still functional after the preceding setup activities.

At step 610, the high dose chamber is closed.

At step 611, N2 flow is set to 2.5-2.8 cfm. Nitrogen is flowed through the inner chamber and outer chamber and back to the environmental control subsystem in order to facilitate heat exchange from the EETP 102 and the environmental control equipment rather than the EETP 102 and the radiation delivery subsystem.

Figure 7:
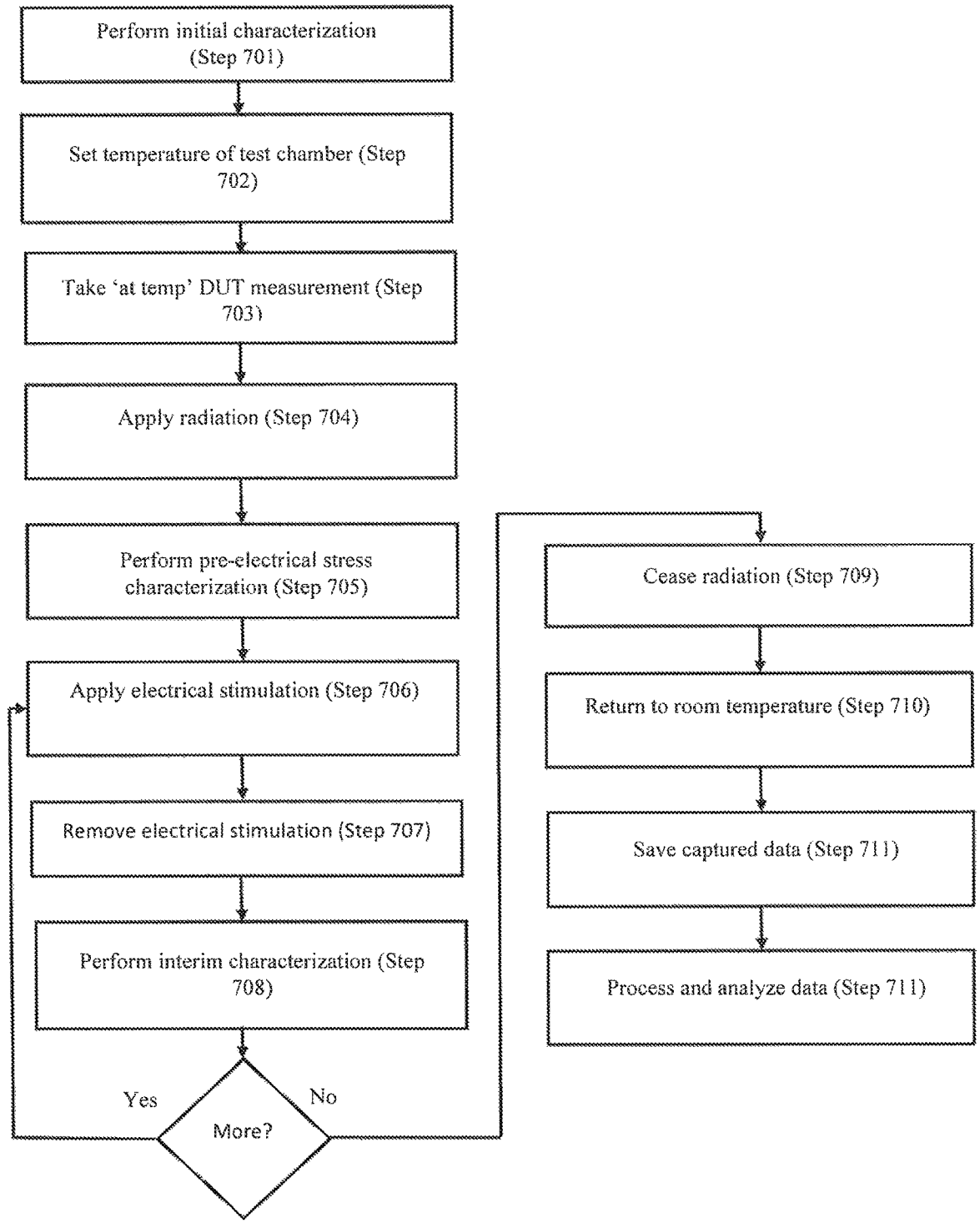
FIG. 7 is a flowchart illustrating steps for performing a method of simultaneously testing the radiation, environmental and electrical reliability of multiple semiconductor electrical devices, in accordance with one illustrative embodiment of the invention.

FIG. 7 is a flowchart illustrating steps for performing a method of simultaneously testing the radiation, environmental and electrical reliability of multiple semiconductor electrical devices, in accordance with one illustrative embodiment of the invention.

The test may involve measuring and analyzing the electric characteristics of one or more DUTs in relation to changes in one or more of the: electrical stress; radiation exposure; and temperature. An exemplary test may include multiple instances performed in which two of the three controllable variables are held constant while the third is varied. If desired, the test may then be repeated for each of the remaining two variables with each being varied while the other two are held constant.

At step 701, an initial characterization is performed. The initial characterization comprises all tests that will be used during the experiment to extract DUT performance parameters. In the case of a metal oxide semiconductor field effect transistor (MOSFET) DUT which will undergo NBTI testing with radiation, the typical NBTI electrical tests will be taken. This is to ensure the DUT is in good working order (i.e. an acceptable test article), to provide ambient temperature data, and provide a baseline that will be compared with post setup DUT data to ensure the DUT was not damaged during the rest of the pre-test setup activities.

At step 702, the temperature of the test chamber is set to a setpoint temperature. For example, in an embodiment in which an NBTI test is being performed, the set temperature may be set at 100 degrees C. A temperature ramp up follows and can take anywhere from minutes to hours, depending on the setpoint.

At step 703, an 'at temperature' DUT measurement is taken in order to confirm the DUT survived the temperature ramp up and provide an 'at temperature' baseline data set before radiation is applied.

At step 704, gamma radiation is applied to the DUT. The gamma radiation is applied by the radiation subsystem 12 according to parameters input by the technician. In an embodiment, the radiation and/or position of the DUT may be set to achieve application of a total ionizing dose to the semiconductor.

At step 705, a pre-electrical stress characterization is performed. The pre-stress characterization comprises of all electrical tests that will be performed over the course of testing in order to provide a baseline for monitoring the performance changes of the DUT over time of testing.

At step 706, if required, an electrical bias stress is applied to the DUT.

At step 707, after a delay of a set amount of time, the bias stress is removed from the DUT. The delay is dependent on the number of data points desired over the course of testing and is test and device dependent. A linear, logarithmic, or custom delay pattern can be programmed.

At step 708, an interim characterization is performed.

If only one interim characterization is desired, at step 709, gamma radiation is ceased being applied to the DUT.

If more than one interim characterization is desired, step 706 through step 708 are repeated.

At step 710, the temperature is returned to a room temperature.

At step 711, data captured during the test is saved.

At step 712, the data is processed and analyzed. As will be described in further detail in reference to FIG. 8 and FIG. 9, the captured data is processed to correct for hardware temperature variation. Radiation and temperature control hardware of the type employed in the system typically have a tolerance of +/−4 degrees C. Transistor DUTs used in space systems can have performance parameters, such as threshold voltage, that change significantly over this tolerance range. Accordingly, subtle trends leading to scientific discovery can be missed without correcting for this variation. The method described below in regard to FIG. 8 and FIG. 9, calibrates any DUT performance parameters across the +/−4 degree C. range due to only temperature changes. Accordingly, the system provides data with 0.1 degree C. variation. With this calibration data, actual test data can be corrected to a single temperature, between the +/−4 degree C. range of the hardware. The result is actual test data can be analyzed across temperature, radiation dose, and electrical stress levels without temperature distortion hiding, possibly important, subtle data trends.

Figure 8:
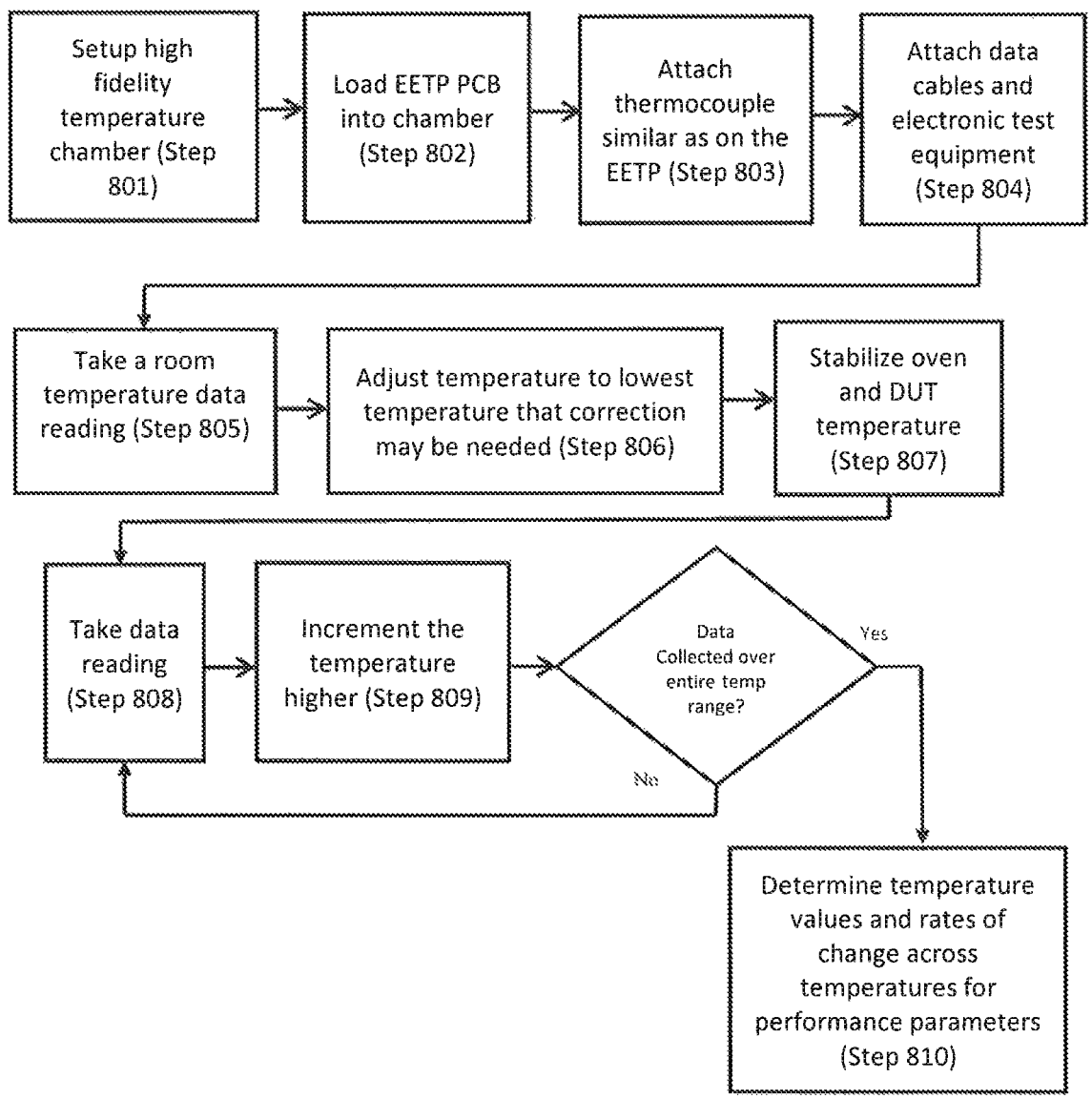
FIG. 8 is a flowchart illustrating steps for acquiring temperature calibration data, in accordance with one illustrative embodiment of the invention.

FIG. 8 is a flowchart illustrating steps for acquiring temperature calibration data, in accordance with one illustrative embodiment of the invention. To temperature correct captured data, the rates of change of DUT performance parameters over temperature ranges must be determined. Once these rates of change are determined, captured data may be temperature corrected.

In step 801, a high fidelity temperature chamber is setup. The high fidelity temperature chamber is distinct from the interconnected subsystems of the system for simultaneously testing the radiation, environmental and electrical reliability of a semiconductor device. The high fidelity temperature chamber provides an environment with precise temperature control.

In step 802, the EETP 102 PCB 105 is loaded into the high fidelity temperature chamber.

In step 803, a thermocouple 109 is attached to the PCB 105 in substantially the same way that it is attached to the DUT while connected to the EETP 102. The attachment similarity is necessary to ensure accurate results.

In step 804, data cables and test equipment are connected which will allow the desired test parameters to be captured during thermal ramping.

In step 805, a room temperature data reading is taken. In the context of a MOSFET DUT in which threshold voltage temperature stability is desired, I-V curves are taken.

In step 806, the temperature in the temperature chamber is adjusted to the lowest temperature in which data may be captured by the system for simultaneously testing.

In step 807, the temperature of the temperature chamber and of the DUT are stabilized.

In step 808, once the temperature chamber and DUT temperatures have settled, a data reading is taken. As in step 805, in the context of a MOSFET DUT in which threshold voltage temperature instability is desired, I-V curves are taken.

In step 809, the temperature is incremented higher by a desired step. The step size is chosen to ensure an accurate temperature correction of EETP 102 data.

If the highest temperature in which data may be captured by the system for simultaneously testing test has not been exceeded, step 808 and step 809 are repeated.

If the highest temperature in which data may be captured by the system for simultaneously testing test has been exceeded, in step 810, data captured from the data readings is processed to determine the temperature values and rates of change across temperatures are known for all important DUT parameters.

Figure 9:
FIG. 9 is a flowchart illustrating steps for temperature correcting data received during electric reliability tests, in accordance with one illustrative embodiment of the invention.

FIG. 9 is a flowchart illustrating steps for temperature correcting data received during electric reliability tests, in accordance with one illustrative embodiment of the invention. Once the rates of change across temperatures are known for all desired DUT parameters, this may be applied to data captured during the simultaneous testing of the DUT while in the radiation chamber.

At step 901, experimental data captured from the system comprises performance parameters of the desired test, such as threshold voltage and on-current for an NBTI test, as well as corresponding temperature, radiation and time values.

At step 902, an initial set of performance parameters, time, radiation and temperature are analyzed.

If the temperature value of the set falls outside of acceptable limits from the desired temperature, at step 903, the temperature calibration data is utilized as a look-up table to determine the temperature dependent offset of each performance parameter.

At step 904, for each performance parameter, the performance variable offset value for that performance parameter is added (subtracted if a negative value) to the performance parameter value to correct for the temperature variation.

At step 905, the raw performance parameter value is replaced by the temperature corrected performance parameter value. The raw temperature value is replaced by the corrected-to temperature.

If all sets of variables have not been analyzed, at step 906, the next set of performance parameters, time, radiation and temperature are analyzed. Steps 903-905 are repeated for this set of data.

Once all sets of data have been analyzed, at step 906, temperature correction is complete and the temperature corrected data may be furthered processed and analyzed to determine trends and relationships.

Temperature corrected data may be further analyzed by plotting to determine trends between parameters. In an exemplary test performed by the inventors, such processing revealed surprising results which would not be apparent had the radiation, environmental and electrical reliability tests been performed separately and the effects added together or had the resulting data not be temperature corrected.

Figure 10:
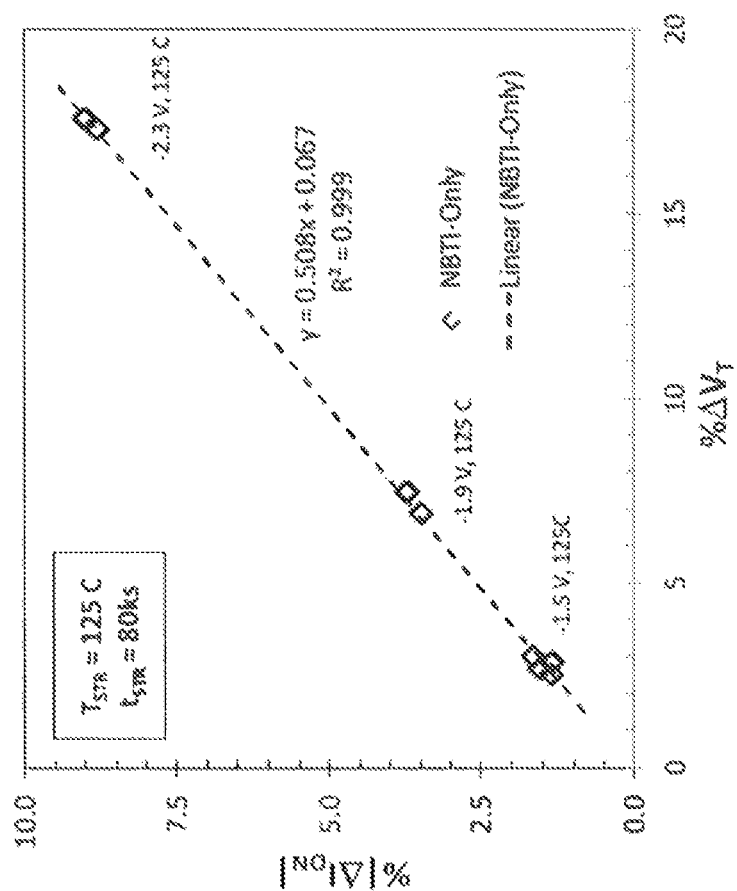
FIG. 10 is a graph plotting the percent change of threshold voltage verses the percent change of on-current after accumulated NBTI-Only stimulation, in accordance with an illustrative embodiment of the invention.

FIG. 10 is a graph plotting the percent change of threshold voltage verses the percent change of on-current after accumulated NBTI-Only stimulation, in accordance with an illustrative embodiment of the invention. The graph of FIG. 10 shows the results of an NBTI test in which electrical stimulation of p-channel MOSFET was applied and temperature was held constant at 125 degrees C. The p-channel MOSFET was not simultaneously irradiated with gamma radiation while electrical stimulation was applied.

Data points represented by squares show the percent change of the on-current of the DUT plotted against the percent change of the threshold voltage at three different levels of electrical bias: −1.5 volts (V), −1.9 volts and −2.3 volts. The electrical bias was applied for a time of $80 \times 10^3$ seconds (s). A line representing a linear fit between the data points has a slope of 0.508 and a vertical intercept of 0.067.

Figure 11:
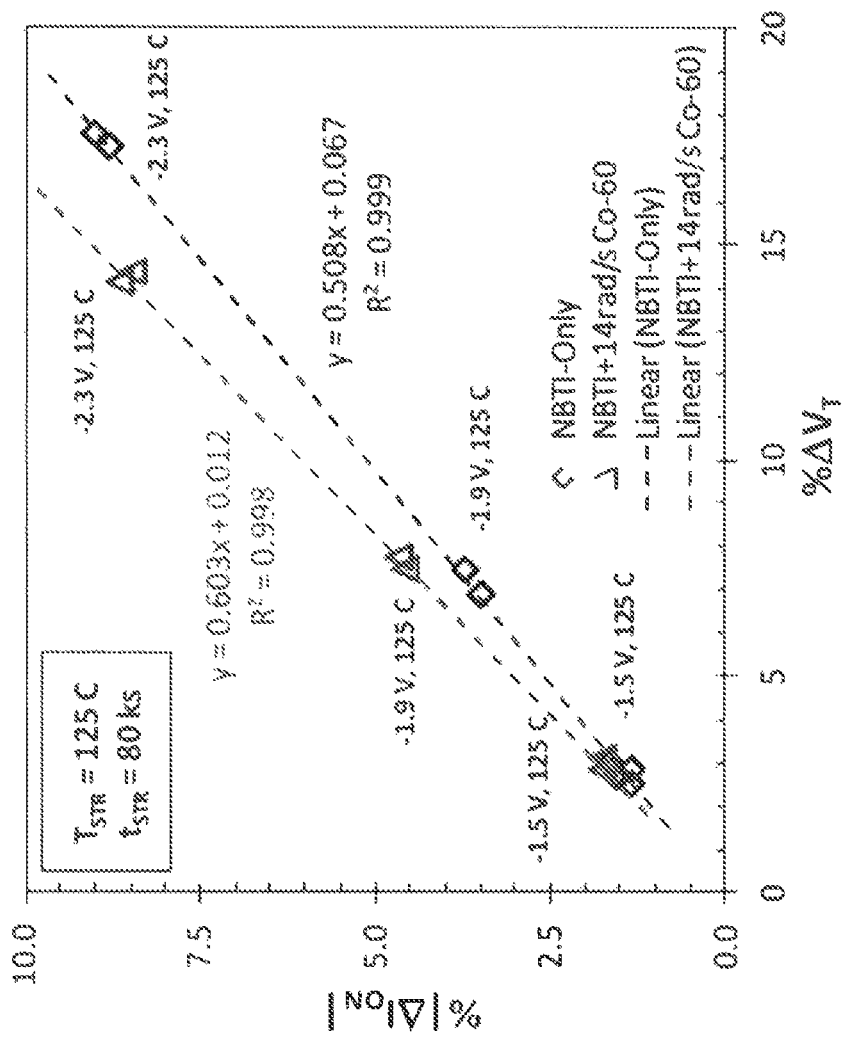
FIG. 11 is a graph plotting the percent change of threshold voltage verses the percent change of on-current after both accumulated NBTI-Only stimulation and accumulated NBTI-stimulation with simultaneous gamma radiation exposure, in accordance with an illustrative embodiment of the invention.

FIG. 11 is a graph plotting the percent change of threshold voltage verses the percent change of on-current after both accumulated NBTI-Only stimulation and accumulated NBTI-stimulation with simultaneous gamma radiation exposure, in accordance with an illustrative embodiment of the invention. The graph of FIG. 11 shows the results of an NBTI test performed by the system described herein and according to the methods described herein. A p-channel MOSFET installed on the EETP 102 was electrically biased while simultaneously being irradiated with gamma radiation at a temperature of 125 degrees C. The NBTI test was performed at electrical biases of −1.5 volts (V), −1.9 volts and −2.3 volts. The MOSFET was simultaneously radiated by the radiation subsystem 12 at a rate of 14 rad(Si)/s by a Cobalt-60 source. The electrical bias and radiation were applied for a time of $80 \times 10^3$ s.

Data points represented by triangles show the percent change of the on-current of the DUT plotted against the percent change of the threshold voltage at the three different levels of electrical bias: −1.5 volts (V), −1.9 volts and −2.3 volts. A line representing a linear fit between the data points has a slope of 0.603 and a vertical intercept of 0.012. For comparative purposes, the graph shown in FIG. 11 further comprises the data points and linear fit line for the NBTI-only test as described in FIG. 10.

Surprisingly, the slopes of the two lines differ substantially. This was an unexpected result and provides the first evidence to the space-electronics community that a model of only a threshold voltage shift with increasing ionizing dose is not comprehensive to describe space-based reliability trends. Further, the slope change and dispersion along the slope of the radiation data sheds light on the physical mechanisms that govern space-based electronic reliability, a topic of much debate in the community. Without simultaneously applying the radiation to the MOSFET during electric bias, this trend would not have been observed.

Figure 12:
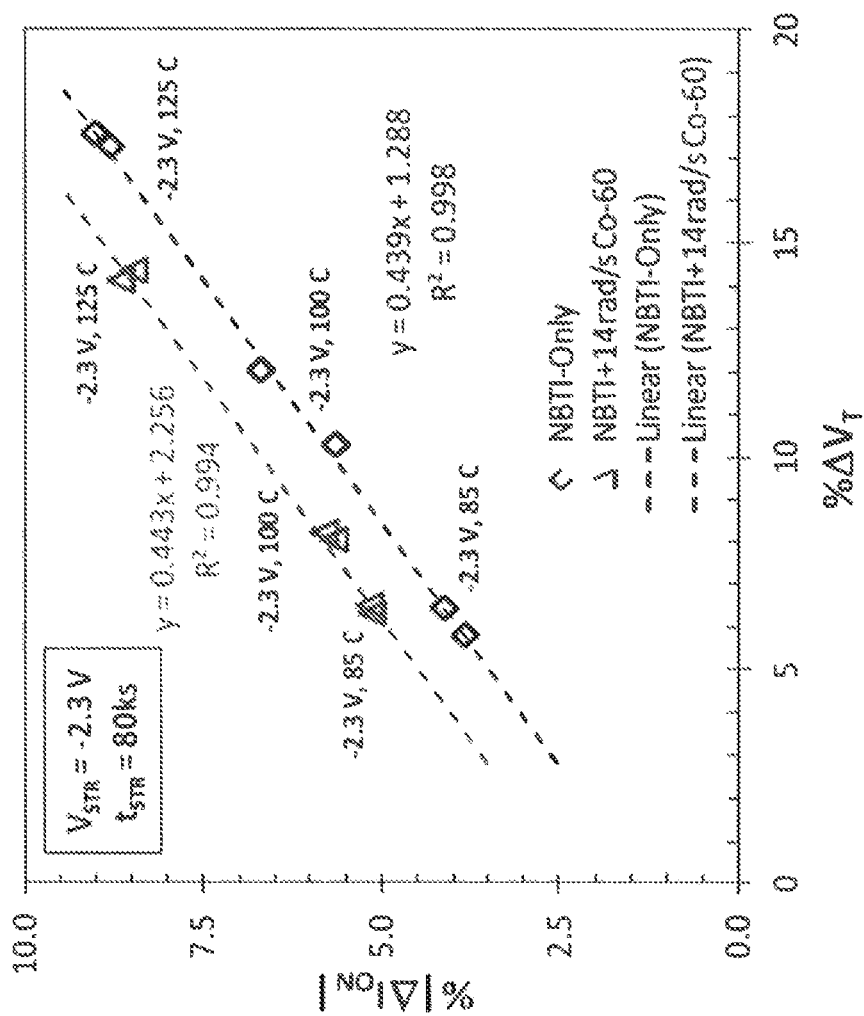
FIG. 12 is a graph plotting the percent change of threshold voltage verses the percent change of on-current after both accumulated NBTI-Only stimulation and accumulated NBTI-stimulation with simultaneous gamma radiation exposure at varied temperatures, in accordance with an illustrative embodiment of the invention.

FIG. 12 is a graph plotting the percent change of threshold voltage verses the percent change of on-current after both accumulated NBTI-Only stimulation and accumulated NBTI-stimulation with simultaneous gamma radiation exposure at varied temperatures, in accordance with an illustrative embodiment of the invention. The graph shows data points for two tests, one in which electrical bias was applied to a p-channel MOSFET in the absence of radiation and one in which electrical bias applied to a p-channel MOSFET while being simultaneously irradiated with gamma radiation. For both tests, an electrical bias of −2.3 V was applied for $80 \times 10^3$ s and data was captured at three different temperatures, 125 C, 100 C and 85 C.

Data points represented by squares, show the results of an NBTI-only test in which electrical bias was applied to a p-channel MOSFET in the absence of radiation. The percent change of the on-current of the DUT plotted against the percent change of the threshold voltage at three different temperatures: 125 C, 100 C and 85 C. A line representing a linear fit between the data points has a slope of 0.439 and a vertical intercept of 1.288.

Data points represented by triangles, show the results of an NBTI test in which electrical bias was applied to a p-channel MOSFET while being simultaneously irradiated by a Cobalt-60 source at a rate of 14 rad(Si)/s. The percent change of the on-current of the DUT plotted against the percent change of the threshold voltage at three different temperatures: 125 C, 100 C and 85 C. A line representing a linear fit between the data points has a slope of 0.443 and a vertical intercept of 2.256.

As can be seen in the graph, the slope of the trend line is unchanged, but the intercept has changed. In addition, dispersion along the trend is observed. Without simultaneously applying the radiation to the MOSFET during electric bias, this trend would not have been observed. The fact that these trends are different for data with simultaneous irradiation and electronic reliability is unexpected by commonly used degradation equations and models. Further, the fact that the trend in temperature space differs from the trend in voltage space is quite interesting and gives new evidence to the debate about what physical mechanisms are at play with respect to space-based reliability.

We claim:

1. A system for simultaneously testing the radiation, environmental and electrical reliability of a semiconductor device under test, the system comprising:
   an electrical environmental subsystem configured for simultaneously providing electrical stimulus to the semiconductor device under test and an isolated thermal testing environment for the semiconductor device under test;
   an environmental control subsystem configured for controlling the thermal testing environment of the electrical environmental subsystem;
   a radiation subsystem configured for simultaneously irradiating the semiconductor device under test with gamma radiation;
   a radiation source control subsystem configured for controlling a radiation dose of the semiconductor device under test;
   a temperature monitoring subsystem configured for recording the temperature of the semiconductor device under test;
   an electrical stimulation and data acquisition subsystem configured for providing electrical stimulation to the semiconductor device under test and acquiring one or more performance parameters of the semiconductor device under test, wherein the one or more performance parameters correspond to a desired reliability test, wherein the desired reliability test is a negative bias transistor instability test and the one or more performance parameters are selected from the group comprising threshold voltage, field effect mobility and on-current, wherein the electrical environmental subsystem is further configured for providing a negative electric bias to the semiconductor device in the thermal testing environment as controlled by the environmental control subsystem while the radiation subsystem is simultaneously irradiating the semiconductor device with the radiation dose of gamma radiation; and
   a data processing and analysis subsystem configured for associating the one or more performance parameters with a corresponding time and temperature recording.

2. The system of claim 1 wherein for each of the one or more performance parameters, the data processing and analysis subsystem is further configured for temperature correcting the performance parameter according to a performance parameter offset value.

3. The system of claim 2 wherein the data processing and analysis subsystem further comprises a temperature calibration data acquisition subsystem for determining a performance parameter offset value for each of the one or more performance parameters.

4. The system of claim 2 wherein for each of the one or more performance parameters, the data is corrected to a tolerance of 0.1 degrees Celsius.

5. The system of claim 1 wherein the electrical environmental subsystem further comprises an electrical environmental test platform comprising:
   a printed circuit board configured for being in electrical communication with the semiconductor device under test under test;
   an inner chamber enclosing the printed circuit board and device under test in an environmentally controlled vacuum;
   an outer chamber configured enclosing the inner chamber and configured for thermally isolating the inner chamber environment from the radiation subsystem; and
   one or more cable assemblies with vacuum sealed feed through fixtures configured for carrying electrical signals into and out of the inner chamber and the outer chamber.

6. The system of claim 5 wherein the printed circuit board comprises a plurality of ports for receiving electrical contacts of the semiconductor device under test.

7. The system of claim 6 wherein the semiconductor device under test is a plurality of devices under test.

8. The system of claim 1 wherein the radiation subsystem comprises a high dose chamber configured for receiving the electrical environmental subsystem.

9. A method of simultaneously testing the radiation, environmental and electrical reliability of a semiconductor device under test comprising the steps of:
   setting the temperature of an electrical environmental test platform test chamber to a test temperature;
   thermally isolating the electrical environmental test platform test chamber;
   irradiating the device under test with gamma radiation;
   applying a negative electrical bias to the semiconductor device under test while the semiconductor device under test is being irradiated with gamma radiation; and
   capturing one or more performance parameters of the semiconductor device under test while the semiconductor device under test is simultaneously exposed to a controlled thermal environment, gamma radiation, and the negative electrical bias, wherein the one or more performance parameters correspond to a desired reliability test, wherein the desired reliability test is a negative bias transistor instability test and the one or more performance parameters are selected from the group comprising threshold voltage, field effect mobility, and on-current; and
   processing data obtained from the semiconductor device under test while the semiconductor device under test is simultaneously exposed to a controlled thermal environment, gamma radiation, and the negative electrical bias, to correct for hardware and temperature variation, wherein the processing comprises determining a performance parameter offset value for each of the performance parameters and temperature correcting the one or more performance parameters according to the respective determined performance parameter offset values.

10. The method of claim 9 further comprising the steps of:
performing an initial characterization of the semiconductor device under test;
performing a pre-radiation characterization of the semiconductor device under test; and
performing a pre-electric stimulation characterization of the semiconductor device under test.

11. A method of simultaneously testing the radiation, environmental and electrical reliability of a semiconductor device under test comprising the steps of:
staging components of a system for simultaneously testing the radiation, environmental and electrical reliability of a semiconductor device under test by performing one or more required metal to metal connections of the system for simultaneously testing the radiation, environmental and electrical reliability of a semiconductor device under test prior to loading the semiconductor device under test onto an electrical environmental test platform, grounding one or more metal elements of the system for simultaneously testing the radiation, environmental and electrical reliability of a semiconductor device under test in a home run configuration, disconnecting an earth ground of an electrical stimulation and data acquisition subsystem of the system from an equipment common ground, flowing ionized air flowing across the electrical environmental test platform, and installing one or more date cable assemblies from an electrical environmental subsystem to an electrical stimulation and data acquisition subsystem;
loading the semiconductor device under test onto an electrical environmental test platform;
preparing the electrical environmental test platform for environmental control;
inserting the electrical environmental test platform into a radiation subsystem;
setting the temperature of an electrical environmental test platform test chamber to a test temperature;
thermally isolating the electrical environmental test platform test chamber;
irradiating the device under test;
applying an electrical bias to the semiconductor device under test while the semiconductor device under test is being irradiated; and
capturing one or more performance parameters of the semiconductor device under test while the semiconductor device under test is simultaneously exposed to a controlled thermal environment, radiation and electric stimulation.

12. The method of claim 11 wherein the one or more metal elements of the system for simultaneously testing the radiation, environmental and electrical reliability of a semiconductor device under test comprise the radiation subsystem, an exhaust pipe and an inner chamber cover, an outer chamber cover and a vacuum pipe of the electrical environmental test platform.

13. The method of claim 11, in which the step of preparing the electrical environmental test platform for electrical and environmental control is performed prior to loading the electrical environmental test platform into the radiation subsystem.

14. The method of claim 11 wherein the step of inserting the electrical environmental test platform into a radiation subsystem further comprises the steps of:
installing an inner chamber cover of the electrical environmental test platform;
installing an outer chamber cover of the electrical environmental test platform;
inserting the electrical environmental test platform into a high dose chamber of the radiation subsystem;
installing an exhaust pipe into the electrical environmental test platform;
installing an inner chamber vacuum hose to the electrical environmental test platform;
installing an outer chamber vacuum hose to the electrical environmental test platform; and
purging an inner chamber and an outer chamber of the electrical environmental test platform.

15. A method for temperature correcting data from a simultaneous test of radiation, environmental and electrical reliability of a semiconductor device under test, the method comprising the steps of:
capturing a raw performance parameter value of the semiconductor device under test while the semiconductor device under test is simultaneously exposed to a controlled thermal environment, radiation and electric stimulation;
associating the raw performance parameter value with an associated time and temperature;
determining a performance parameter offset value of the raw performance parameter value according to the temperature associated with the raw performance parameter value by inserting a semiconductor device under test into a temperature test chamber, measuring a room temperature value of the performance parameter, setting the temperature of the temperature test chamber to a first endpoint of a desired temperature range, measuring a value of the performance parameter at the first endpoint of the desired temperature range, incrementing through a series of temperatures to a second endpoint of the desired temperature range by a desired step, at each increment measuring a value of the performance parameter, and determining the rate of change across the desired temperature range for the performance parameter; and
adding the performance parameter offset value to the raw performance parameter value to determine a corrected performance parameter value.

* * * * *